(12) United States Patent
Horikiri et al.

(10) Patent No.: US 12,166,086 B2
(45) Date of Patent: Dec. 10, 2024

(54) EPITAXIAL SUBSTRATE

(71) Applicant: SUMITOMO CHEMICAL COMPANY, LIMITED, Tokyo (JP)

(72) Inventors: Fumimasa Horikiri, Hitachi (JP); Yoshinobu Narita, Hitachi (JP); Kenji Shiojima, Fukui (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 916 days.

(21) Appl. No.: 17/272,182

(22) PCT Filed: Aug. 20, 2019

(86) PCT No.: PCT/JP2019/032502
§ 371 (c)(1),
(2) Date: Oct. 14, 2021

(87) PCT Pub. No.: WO2020/045172
PCT Pub. Date: Mar. 5, 2020

(65) Prior Publication Data
US 2022/0045177 A1    Feb. 10, 2022

(30) Foreign Application Priority Data
Aug. 31, 2018    (JP) .................. 2018-163640

(51) Int. Cl.
*H01L 29/36* (2006.01)
*H01L 29/20* (2006.01)

(52) U.S. Cl.
CPC .......... *H01L 29/36* (2013.01); *H01L 29/2003* (2013.01)

(58) Field of Classification Search
CPC .................. H01L 29/36; H01L 29/2003; H01L 21/02389; H01L 21/02433; H01L 21/0254; H01L 21/02576; H01L 21/0262; H01L 29/04–045; H01L 21/2022–2026; H01L 21/2033–2036; H01L 21/02293; H01L 21/02631; C23C 16/4488; C23C 16/34;
(Continued)

(56) References Cited

U.S. PATENT DOCUMENTS

2017/0067830 A1* 3/2017 Adell .................. G01R 31/2648
2019/0305090 A1* 10/2019 Tomita .................. H01L 29/36

FOREIGN PATENT DOCUMENTS

JP    2007-299793 A    11/2007
JP    2010-141037 A    6/2010
(Continued)

OTHER PUBLICATIONS

International Preliminary Report on Patentability issued in connection with International Patent Application No. PCT/JP2019/032502, dated Mar. 2, 2021.
(Continued)

*Primary Examiner* — Shahed Ahmed
(74) *Attorney, Agent, or Firm* — Foley & Lardner LLP

(57) ABSTRACT

There is provided an epitaxial substrate, including: a GaN substrate whose main surface is a c-plane; and a GaN layer epitaxially grown on the main surface, wherein the main surface includes a region where an off-angle is 0.4° or more, and an E3 trap concentration in the GaN layer grown on the region is $3.0 \times 10^{13}$ cm$^{-3}$ or less.

3 Claims, 5 Drawing Sheets

(58) Field of Classification Search
CPC ..... C30B 25/186; C30B 29/406; C30B 25/20; C30B 25/02–22; H01J 37/32
See application file for complete search history.

(56) References Cited

FOREIGN PATENT DOCUMENTS

| | | |
|---|---|---|
| JP | 2010-219490 A | 9/2010 |
| WO | WO-2018/123285 A1 | 7/2018 |

OTHER PUBLICATIONS

International Searching Authority, "International Search Report," issued in connection with International Patent Application No. PCT/JP2019/032502, dated Nov. 19, 2019.

International Searching Authority, "Written Opinion," issued in connection with International Patent Application No. PCT/JP2019/032502, dated Nov. 19, 2019.

Tanaka et al., "Deep-level transient spectroscopy of low-free-carrier-concentration n-GaN layers grown on freestanding GaN substrates: Dependence on carbon compensation ratio," Japanese Journal of Applied Physics, vol. 55, No. 6, 2016, pp. 061101-1 to 061101-4.

\* cited by examiner

EPITAXIAL SUBSTRATE

CROSS-REFERENCE TO RELATED APPLICATIONS

The present application claims priority under 37 U.S.C. § 371 to International Patent Application No. PCT/JP2019/032502, filed Aug. 20, 2019, which claims priority to and the benefit of Japanese Patent Application No. 2018-163640, filed on Aug. 31, 2018. The contents of these applications are hereby incorporated by reference in their entireties.

TECHNICAL FIELD

The present disclosure relates to an epitaxial substrate.

DESCRIPTION OF RELATED ART

Gallium nitride (GaN) is used as a material for manufacturing semiconductor devices such as light emitting devices and transistors. A high-performance semiconductor device can be obtained by using a high-quality GaN layer epitaxially grown on a GaN substrate.

A trap contained in a GaN layer deteriorates properties of the semiconductor device. An electron trap E3 (also referred to as an E3 trap hereafter) is known as a main trap contained in the GaN layer, and E3 trap concentration in the GaN layer is preferably low. Further, a variation in the E3 trap concentration in the GaN layer is preferably small. Non-Patent Document 1 explains that the E3 trap concentration increases as a carbon concentration in the GaN layer decreases.

PRIOR ART DOCUMENT

Non-Patent Document

Non-Patent Document 1: "Deep-level transient spectroscopy of low-free-carrier-concentration n-GaN layers grown on freestanding GaN substrates: Dependence on carbon compensation ratio", Japanese Journal of Applied Physics 55, 061101 (2016) by T. Tanaka, K. Shiojima, T. Mishima and Y. Tokuda.

SUMMARY OF THE DISCLOSURE

Problem to be Solved by the Disclosure

An object of the present disclosure is to provide an epitaxial substrate including an epitaxially grown GaN layer on a GaN substrate and in which high/low level of E3 trap concentration in the GaN layer is suppressed.

Another object of the present disclosure is to provide an epitaxial substrate including an epitaxially grown GaN layer on a GaN substrate and in which variations in E3 trap concentration in the GaN layer are suppressed.

Means for Solving the Problem

According to an aspect of the present disclosure, there is provided an epitaxial substrate, including:
a GaN substrate whose main surface is a c-plane; and
a GaN layer epitaxially grown on the main surface,
wherein the main surface includes a region where an off-angle is 0.4° or more, and E3 trap concentration in the GaN layer grown on the region is $3.0 \times 10^{13}$ cm$^{-3}$ or less.

According to another aspect of the present disclosure, there is provided an epitaxial substrate, including:
a GaN substrate whose main surface is a c-plane;
a GaN layer epitaxially grown on the main surface,
wherein the main surface includes a region where an off-angle is 0.4° or more, and in the GaN layer grown on the region, a ratio of a maximum E3 trap concentration to a minimum E3 trap concentration is 1.5 times or less.

According to further another aspect of the present invention, there is provided an epitaxial substrate, including:
a GaN substrate whose main surface is a c-plane;
a GaN layer epitaxially grown on the main surface,
wherein an E3 trap concentration in the GaN layer tends to decrease as an off-angle on the main surface increases.

Advantage of the Invention

There is provided an epitaxial substrate including an epitaxially grown GaN layer on a GaN substrate, with suppressed high/low level of E3 trap concentration, or suppressed variation in the E3 trap concentration in the GaN layer.

DETAILED DESCRIPTION OF THE INVENTION

Figure 1A:
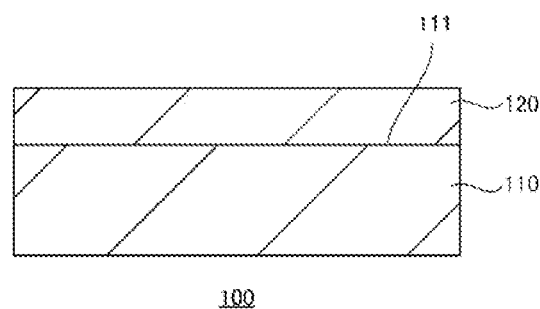
FIG. 1 (a) is a schematic cross-sectional view illustrating an epitaxial substrate according to an embodiment of the present invention, and FIG. 1 (b) is a schematic perspective view illustrating a measurement sample in an experimental example.
Figure 1B:
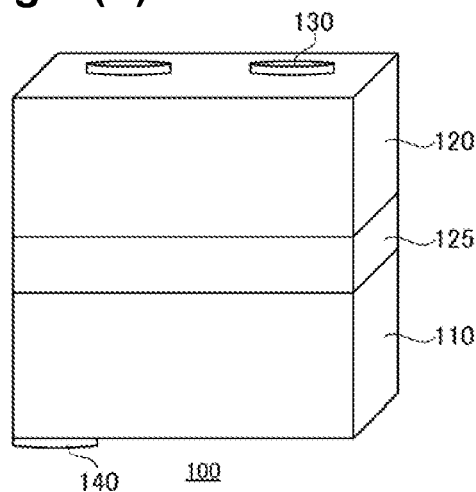

An epitaxial substrate 100 (hereinafter, also referred to as epi substrate 100) according to an embodiment of the present invention will be described. FIG. 1 (a) is a schematic cross-sectional view of the epi substrate 100. The epi substrate 100 includes a gallium nitride (GaN) substrate 110 (hereinafter, also referred to as a substrate 110) and a GaN layer 120 (hereinafter, also referred to as an epi layer 120) epitaxially grown on the substrate 110.

The substrate 110 comprises GaN single crystal and has a main surface 111 which is a c-plane. The fact that the main surface 111 is the c-plane means that a crystal plane having a lowest index and closest to the main surface 111 is the c-plane of a GaN single crystal constituting the substrate 110. An angle formed by a normal direction of the main surface 111 and c-axis direction of the GaN single crystal constituting the substrate 110 is an off-angle. The main surface 111 preferably includes a region having an off-angle of 0.4° or more, and more preferably includes a region having an off-angle of 0.6° or more. An upper limit of the size of the off-angle on the main surface 111 is, for example, 1.2°.

In order to increase crystallinity of the epi layer 120, it is preferable that the substrate 110 has high crystallinity. Specifically, an average dislocation density of the substrate 110 is preferably less than, for example, $1 \times 10^7$ cm$^{-2}$, and in order to improve in-plane uniformity, it is more preferable that the substrate 110 does not include a dislocation concentration region having a dislocation density of $1 \times 10^7$ cm$^{-2}$ or more. As a crystal growth method for obtaining such a substrate 110, for example, a Void-assisted Separation Method (VAS) method is preferably used.

The c-plane of the GaN crystal constituting the substrate 110 is formed in a curved shape due to the fact that initial nuclei attract each other when the GaN crystal is grown. Thereby, the off-angle in the main surface 111 changes depending on a position and has an off-angle distribution (see FIGS. 3 (a) and 3 (b)). The off-angle at a center of the main surface 111 is a central off-angle. The central off-angle can be controlled, for example, by adjusting the off-angle on the base substrate (for example, sapphire substrate) when growing the GaN crystal by the VAS method, and may be set to incline in a predetermined direction (for example, a-axis direction, and for example, m-axis direction) (see FIGS. 3 (a) and 3 (b)).

For example, by using the VAS method, crystal growth can be carried out so as not to generate the above-described dislocation concentration region, and therefore it is possible to obtain a GaN crystal having a c-plane with little distortion (a c-plane that can be precisely defined using a constant curvature in the a-axis direction and a constant curvature in the m-axis direction). Thereby, off-angle distribution in the main surface 111, which occurs according to a curved shape of the c-plane, can be satisfactorily controlled. A width of the off-angle distribution can be narrowed as a radius of curvature of the c-plane increases (that is, as a shape of the c-plane becomes closer to a plane).

The epi layer 120 comprises a GaN single crystal epitaxially grown on the main surface 111 of the substrate 110. The off-angle on the epi layer 120 epitaxially grown on a predetermined position in the main surface 111, can be represented by an off-angle at the predetermined position in the main surface 111. As will be described later in detail, inventors of the present disclosure obtain a finding such that a concentration of an electron trap E3 (hereinafter, also referred to as E3 trap), which is a point defect contained in the epi layer 120 of the present embodiment, tends to decrease as the off-angle increases (see FIG. 5). Also, in this tendency, the inventors of the present disclosure obtain a finding such that the degree of decrease in the E3 trap concentration becomes small as the off-angle increases (see FIG. 5).

Since the E3 trap deteriorates properties of the semiconductor device comprising GaN, the E3 trap concentration in the epi layer 120 is preferably low. Further, in order to reduce a variation in the properties of the semiconductor device due to the E3 trap, it is preferable that the variation in the E3 trap concentration in the plane of the epi layer 120 is small.

In the present embodiment, specifically, since the off-angle in the main surface 111 is 0.4° or more, that is, in the epi layer 120 grown on the region where the off-angle is 0.4° or more, the E3 trap concentration can be preferably $3.0 \times 10^{13}$ cm$^{-3}$ or less, more preferably $2.5 \times 10^{13}$ cm$^{-3}$ or less.

More preferably, since the off-angle in the main surface 111 is 0.6° or more, that is, in the epi layer 120 grown on the region where the off-angle size is 0.6° or more, the E3 trap concentration can be $2.3 \times 10^{13}$ cm$^{-3}$ or less. As described above, according to the present embodiment, since the off-angle is for example, 0.4° or more, the epi layer 120 having a low E3 trap concentration can be obtained.

In the above tendency, the degree of decrease in the E3 trap concentration becomes small, as the off-angle increases. Therefore, the larger the off-angle, the smaller a fluctuation range of the E3 trap concentration, that is, the smaller the variation. Specifically, since the off-angle in the main surface 111 is 0.4° or more, that is, in the epi layer 120 grown on a region where the off-angle is 0.4° or more, the ratio of the maximum E3 trap concentration to the minimum E3 trap concentration can be preferably 1.5 times or less, more preferably 1.3 times or less. More preferably, since the off-angle in the main surface 111 is 0.6° or more, that is, in the epi layer 120 grown on a region where the off-angle is 0.6° or more, the ratio of the maximum E3 trap concentration to the minimum E3 trap concentration can be 1.2 times or less. As described above, according to the present embodiment, since the off-angle is, for example, 0.4° or more, the epi layer 120 with small in-plane variation in the E3 trap concentration, that is, with high in-plane uniformity of the E3 trap concentration, can be obtained The epi layer 120 is formed, for example, by Metalorganic vapor phase epitaxy: MOVPE), and contains carbon (C) derived from a group III raw material such as trimethylgallium (TMG), as an impurity. According to a conventional finding regarding a relationship between the off-angle and the concentration of C mixed in the GaN layer, as the off-angle increases, the C concentration decreases. Further, according to the conventional finding regarding a relationship between the concentration of C mixed in the GaN layer and the concentration of the electron trap E3 (see Non-Patent Document 1), as the C concentration decreases, the E3 trap concentration increases. Based on these conventional findings, it can be considered that the E3 trap concentration increases because the C concentration decreases as the off-angle increases.

However, as described above, according to the findings obtained by the present inventors, the epi layer 120 included in the epi substrate 100 according to the present embodiment has a characteristic that the E3 trap concentration decreases as the off-angle increases. In the present embodiment, although a mechanism of obtaining the characteristics different from those inferred from the conventional finding is not clear, as will be described in detail later, it can be considered that growing the epi layer 120 with MOVPE using a catalyst (eg tungsten (W)) that promotes a decomposition of a group V raw material (eg ammonia (NH$_3$)), contributes to keeping the E3 trap concentration low even when the off-angle increases and the C concentration decreases.

The substrate 110 and the epi layer 120 of the present embodiment contain n-type impurities. Examples of the n-type impurities include silicon (Si) and germanium (Ge), etc. The n-type impurity is added to the substrate 110 at a concentration of, for example, $1 \times 10^{18}$ cm$^{-3}$ or more and $1 \times 10^{19}$ cm$^{-3}$ or less. Also, the n-type impurity is added to the epi layer 120 at a concentration of, for example, $3 \times 10^{15}$ cm$^{-3}$ or more and $5 \times 10^{16}$ cm$^{-3}$ or less. A thickness of the substrate 110 is not particularly limited, but is, for example, 400 μm. A thickness of the epi layer 120 is, for example, 10 μm or more and 30 μm or less.

The epi layer 120 corresponds to a drift layer when manufacturing a semiconductor device such as a Schottky diode or a pn junction diode using the epi substrate 100. The n-type impurity concentration of the epi layer 120 (more accurately, a carrier concentration $N_D$) is preferably not too low from a viewpoint of suppressing on-resistance, and for example, it is preferably $3\times10^{15}$ cm$^{-3}$ or more, and more preferably $6\times10^{15}$ cm$^{-3}$ or more. Further, the n-type impurity concentration of the epi layer 120 (more accurately, carrier concentration $N_D$) is preferably not too high from a viewpoint of improving a pressure resistance, and for example, it is preferably $5\times10^{16}$ cm$^{-3}$ or less, and more preferably $1\times10^{16}$ cm$^{-3}$ or less. A thickness of the epi layer 120 is preferably not too thin, and for example, it is preferably 10 µm or more. Further, a thickness of the epi layer 120 is preferably not too thick from a viewpoint of suppressing on-resistance and preferably it is 30 µm or less. Another epi layer 125 having a higher n-type impurity concentration than the epi layer 120 may be interposed between the epi layer 120 corresponding to the drift layer and the substrate 110 (see FIG. 1 (b)).

Figure 2:
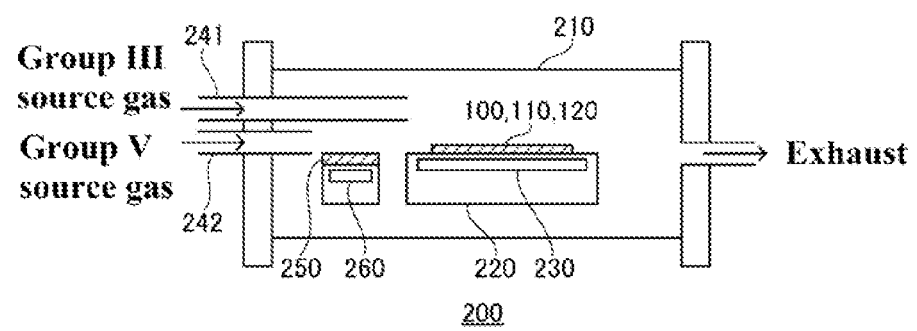
FIG. 2 is a schematic view conceptually illustrating a MOVPE apparatus used for manufacturing an epitaxial substrate according to an embodiment of the present invention.

Next, a method for manufacturing the epi substrate 100 according to the present embodiment will be described. FIG. 2 is a schematic view conceptually illustrating a MOVPE apparatus 200 used for manufacturing the epi substrate 100. A susceptor 220 for mounting the substrate 110 is installed in a reactor 210 of the MOVPE apparatus 200. A heater 230 for heating the substrate 110 to a predetermined temperature is installed below an installing surface of the susceptor 220. A gas supply pipe 241 for supplying group III raw material (for example, TMG) toward the substrate 110, and a supply pipe 242 for supplying group V raw material (for example, $NH_3$) toward the substrate 110, are introduced into the reactor 210.

A catalyst 250 that promotes a decomposition of the group V raw material is arranged between the gas supply pipe 242 that supplies the group V raw material, and the susceptor 220. For example, $NH_3$ is preferably used as the group V raw material, and W is preferably used as the catalyst 250 that promotes the decomposition of $NH_3$. A heater 260 for heating the catalyst 250 to a predetermined temperature is installed at a lower part of the catalyst 250. By using the catalyst 250, it is possible to improve utilization efficiency of the group V raw material in the growth of the GaN crystal.

In the present embodiment, the epi substrate 100 is manufactured by supplying the group V raw material and the group III raw material onto the substrate 110 to grow the epi layer 120 using such a MOVPE apparatus 200, while promoting the decomposition of the group V raw material by the catalyst 250, specifically, while promoting the decomposition of $NH_3$ by W.

The following are exemplified as the growth conditions of the epi layer 120. A substrate temperature is, for example, 1,100 to 1,260° C., and a flow rate ratio V/III of the group V source gas to the group III source gas is, for example, 160 to 5,000. A heating temperature of a catalyst 250 is, for example, 300 to 700° C.

FIG. 2 conceptually illustrates a MOVPE apparatus 200 for performing growth using the catalyst 250 that promotes the decomposition of the group V raw material, and in the MOVPE apparatus used for actual growth, various changes may be made as necessary. For example, in order to add n-type impurity to the epi layer 120, the MOVPE apparatus may include a gas supply pipe for supplying the n-type impurity raw material. For example, silane ($SiH_4$) is used as the n-type impurity raw material.

Experimental Example

Next, an experimental example will be described. FIG. 1 (b) is a schematic perspective view illustrating a measurement sample in this experimental example. An epi substrate 100 in which the epi layer 120 was grown through the epi layer 125 was prepared on the substrate 110. A measurement sample was prepared by forming a Schottky electrode 130 on a top surface of the epi layer 120 of the epi substrate 100 and forming an ohmic electrode 140 on a bottom surface of the substrate 100 of the epi substrate 100. The Schottky electrode 130 was formed of a nickel (Ni) layer having a thickness of 100 nm and a diameter of 200 µm. The ohmic electrode 140 was formed of an indium gallium (InGa) layer.

Figure 3B:
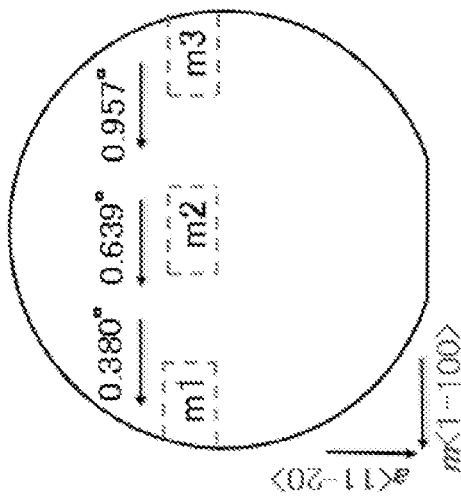
FIGS. 3 (a) and 3 (b) are schematic plan views illustrating a substrate used in the experimental example.
Figure 3A:
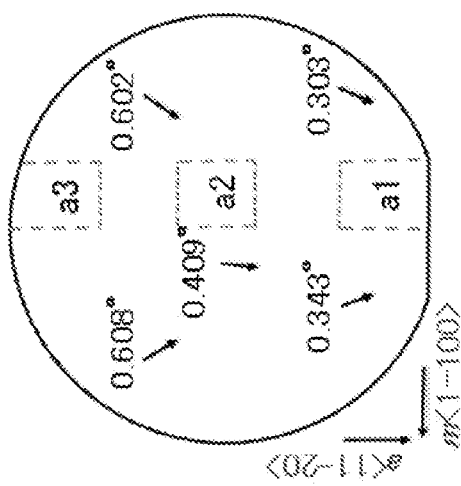

FIGS. 3 (a) and 3 (b) are schematic plan views illustrating the substrate 110 used in this experimental example. In this experimental example, the substrate 110 prepared by the VAS method was used. Specifically, three substrates 110 (substrates a1, a2 and a3) cut out from a GaN substrate whose off-angle direction at the center of the substrate (a-axis direction of off-substrate) is parallel to the a-axis direction as illustrated in FIG. 3 (a), and three substrates 110 (substrates m1, m2 and m3) cut out from a GaN substrate whose off-angle direction at the center of the substrate (m-axis direction of off-substrate) is parallel to the m-axis direction as illustrated in FIG. 3 (b), were prepared. The off-angle directions of the substrates a1, a2, and a3 were all substantially parallel to the a-axis direction, and the off-angle sizes were a1: 0.303°, a2: 0.409°, and a3: 0.602.°. The off-angle directions of the substrates m1, m2, and m3 were all substantially parallel to the m-axis direction, and the off-angle sizes were m1: 0.380°, m2: 0.639°, and m3: 0.957.°. The dislocation densities of the substrates a1, a2, a3, m1, m2 and m3 were all $3\times10^6$ cm$^{-2}$.

The epi layer 125 and the epi layer 120 were grown by MOVPE on the substrates a1, a2, a3, m1, m2 and m3, respectively, and thereafter the Schottky electrode 130 and the ohmic electrode 140 were formed. A GaN layer having a thickness of 2 µm and a Si concentration of $2\times10^{18}$ cm$^{-3}$ was grown as the epi layer 125, and a GaN layer having a thickness of 13 µm and a Si concentration of $9\times10^{15}$ cm$^{-3}$ was grown as the epi layer 120. As described above, 6 types of measurement samples were prepared. Hereinafter, each measurement sample will be referred to by the name of the corresponding substrate (a1 to m3). The growth conditions were the same among the measurement samples a1, a2, a3, m1, m2 and m3, to prevent variations in the properties of the epi layers 125 and variations in the properties of the epi layers 120 due to differences in growth conditions.

Figure 4A:
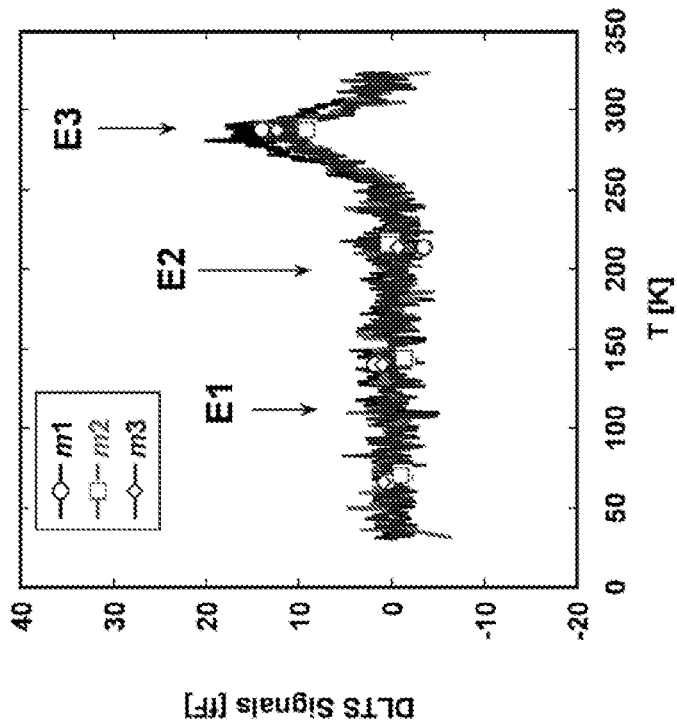
FIG. 4 (a) illustrates DLTS spectra of measurement samples a1 to a3 in the experimental example.
FIG. 4(b) illustrates DLTS spectra of measurement samples m1 to m3 in the experimental example.
Figure 4B:
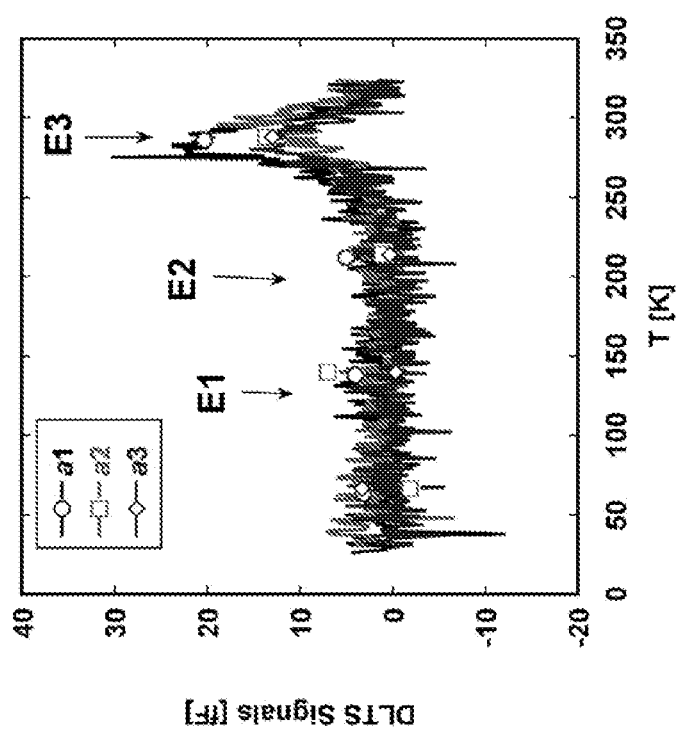

Deep level transient spectroscopy (DLTS) measurement was performed on the measurement samples a1 to m3. The DLTS measurement was performed in a temperature range of 30-320K. FIG. 4 (a) illustrates DLTS spectra of the measurement samples a1 to a3, and FIG. 4 (b) illustrates DLTS spectra of the measurement samples m1 to m3. In FIGS. 4 (a) and 4 (b), the horizontal axis represents a temperature with K units, and the vertical axis represents a DLTS signal with fF units. The DLTS spectra of the measurement samples a1 to a3 are shown with circular plots, square plots, and a diamond-shaped plots, respectively. The DLTS spectra of the measurement samples m1 to m3 are shown with circular plots, square plots, and a diamond-shaped plots, respectively.

A clear peak is observed around 270K in all of the measurement samples a1 to m3. From the Arrhenius plot, the peak is identified as an E3 trap with an energy level of about −0.6 eV. The E3 trap concentrations in the measurement samples a1 to m3 are a1: $3.72\times10^{13}$ cm$^{-3}$, a2: $2.38\times10^{13}$ cm$^{-3}$, a3: $2.22\times10^{13}$ cm$^{-3}$, m1: $2.51\times10^{13}$ cm$^{-3}$, M2: $2.11\times10^{13}$ cm$^{-3}$, m3: $2.07\times10^{13}$ cm$^{-3}$. In any of the measurement samples a1 to m3, the peak corresponding to E1 trap with energy level Ec of about −0.25 eV, and the peak corresponding to E2 trap with energy level Ec of about −0.3 eV, are not clearly observed.

(n-type) carrier concentration $N_D$ was measured by further performing capacitance-voltage (CV) measurement on the measurement samples a1 to m3. The carrier concentrations $N_D$ in the measurement samples a1 to m3 are a1: $5.3\times10^{15}$ cm$^{-3}$, a2: $6.5\times10^{15}$ cm$^{-3}$, a3: $8.1\times10^{15}$ cm$^{-3}$, m1: $7.7\times10^{15}$ cm$^{-3}$, M2: $7.9\times10^{15}$ cm$^{-3}$, m3: $9.7\times10^{15}$ cm$^{-3}$.

Figure 5:
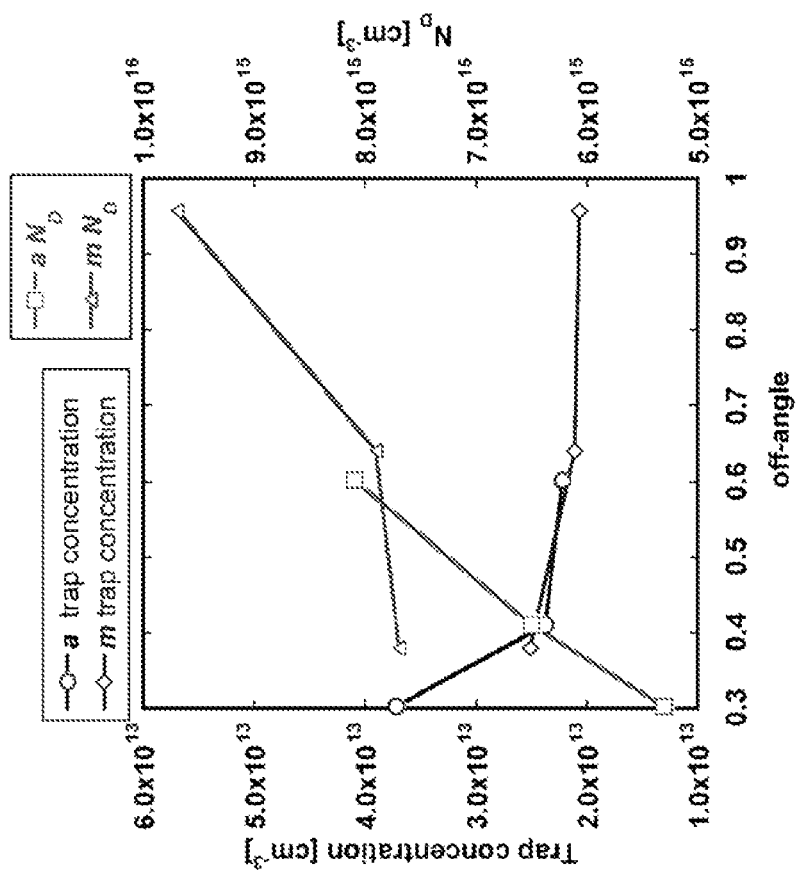
FIG. 5 is a graph illustrating a dependence of E3 trap concentration on the size of the off-angle and the dependence of carrier concentration ND on the size of the off-angle in the measurement samples a1 to m3 in the experimental example.

FIG. 5 is a graph showing a dependence of E3 trap concentration on the size of the off-angle in the measurement samples a1 to m3 (also simply referred to as E3 trap concentration dependence hereafter), and a dependence of the carrier concentration $N_D$ on the size of the off-angle (also simply referred to as carrier concentration dependence hereafter). These measurement results show the properties of the epi layer 120 in each of the measurement samples a1 to m3. The horizontal axis represents the size of the off-angle with degrees, and the left side of the vertical axis represents the E3 trap concentration with cm$^{-3}$ unit, and the right side of the vertical axis represents the carrier concentration $N_D$ with cm$^{-3}$ units. The E3 trap concentrations of the measurement samples a1 to a3 are shown with circular plots, and the E3 trap concentrations of the measurement samples m1 to m3 are shown with diamond-shaped plots. The carrier concentrations $N_D$ of the measurement samples a1 to a3 are shown with square plots, and the carrier concentrations $N_D$ of the measurement samples m1 to m3 are shown with triangular plots.

The E3 trap concentration dependence tends to decrease as the off-angle increases. Further, in this tendency, as the off-angle increases, the degree of decrease in the E3 trap concentration becomes small (it becomes closer to horizontal in the graph). It can be said that the E3 trap concentration almost independent of whether the off-angle direction is parallel to the a-axis direction or parallel to the m-axis direction.

The E3 trap concentration decreases sharply while the off-angle increases from 0.3° to 0.4°. In contrast, when the off-angle is 0.4° or more, the E3 trap concentration gradually decreases. Accordingly, it is preferable that the off-angle is 0.4 or more in order to keep the E3 trap concentration low. By setting the off-angle to 0.4° or more, the E3 trap concentration can be preferably $3.0\times10^{13}$ cm$^{-3}$ or less, more preferably $2.5\times10^{13}$ cm$^{-3}$ or less. More preferably, by setting the off-angle to 0.6° or more, the E3 trap concentration can be, for example, $2.3\times10^{13}$ cm$^{-3}$ or less.

Since the E3 trap concentration gradually decreases when the off-angle is 0.4° or more, a fluctuation range of the E3 trap concentration, that is, a variation can be reduced by setting the off-angle to 0.4° or more. An upper limit of the size of the off-angle is, for example, 1.2°. The E3 trap concentration at the off-angle of 1.2° is estimated to be about $2.0\times10^{13}$ cm$^{-3}$. In contrast, when the off-angle is 0.4°, the E3 trap concentration is, for example, $3.0\times10^{13}$ cm$^{-3}$ or less, and for example $2.5\times10^{13}$ cm$^{-3}$ or less. Accordingly, by setting the off-angle to 0.4° or more, the ratio of the maximum E3 trap concentration to the minimum E3 trap concentration can be preferably 1.5 times ("$3.0\times10^{13}$ cm$^{-3}$/$2.0\times10^{13}$ cm$^{-3}$" times) or less, more preferably 1.3 times ("$2.5\times10^{13}$ cm$^{-3}$/$2.0\times10^{13}$ cm$^{-3}$" times) or less.

Further, when the off-angle is 0.6°, the E3 trap concentration is, for example, $2.3\times10^{13}$ cm$^{-3}$ or less. Thereby, more preferably, by setting the off-angle to 0.6° or more, the ratio of the maximum E3 trap concentration to the minimum E3 trap concentration can be 1.2 times ("$2.3\times10^{13}$ cm$^{-3}$/$2.0\times10^{13}$ cm$^{-3}$" times) or less.

The carrier concentration dependence tends to increase as the off-angle increases, that is, decreases as the off-angle decreases. According to the finding by secondary ion mass spectrometry (SIMS) measurement, the Si concentration is almost independent of the size of the off-angle and is constant, and the C concentration tends to increase as the off-angle decreases. The tendency for the carrier concentration $N_D$ to decrease as the off-angle decreases is considered to be due to the carrier compensation due to the increase in the C concentration.

When the off-angle is about 1°, the carrier concentration $N_D$ of about $1\times10^{16}$ cm$^{-3}$, which is close to the Si concentration of $9\times10^{15}$ cm$^{-3}$ as a design value, is obtained. In contrast, when the off-angle is about 0.3°, the carrier concentration $N_D$ decreases to about $5\times10^{15}$ cm$^{-3}$. From this fact, the concentration of C mixed in the epi layer 120 of the measurement samples a1 to m3 (therefore, the C concentration in a region where the off-angle is 0.4° or more) is estimated to be about $5\times10^{15}$ cm$^{-3}$ at most.

When the off-angle is about 1°, the carrier concentration $N_D$ of about $1\times10^{16}$ cm$^{-3}$, which is close to the Si concentration of $9\times10^{15}$ cm$^{-3}$ as a design value, is obtained. Therefore, it is considered that the carrier concentration $N_D$ hardly increases even when the off-angle further increases. For example, by setting the off-angle to 0.4° or more, the carrier concentration $N_D$ of $6\times10^{15}$ cm$^{-3}$ or more and $1\times10^{16}$ cm$^{-3}$ or less can be obtained.

Thus, according to this experimental example, by increasing the off-angle to, for example, 0.4° or more, it is possible to obtain the epi layer 120 in which both a low E3 trap concentration and a high carrier concentration $N_D$ are compatible.

The C concentration in the epi layer 120 tends to increase as the off-angle decreases, that is, decreases as the off-angle increases. As described above, according to the conventional finding, it is said that the E3 trap concentration increases as the C concentration decreases, and therefore it also appears that the E3 trap concentration increases as the off-angle increases. However, in this experimental example, the E3 trap concentration tends to decrease as the off-angle increases. The mechanism of E3 trap generation has not yet been clarified, and the mechanism of obtaining such a tendency in this experimental example is not clear. However, for example, the following hypothesis can be considered as the reason why the E3 trap concentration can be kept low in spite of the low C concentration when the off-angle is large.

In the growth of the GaN crystal constituting the epi layer 120, the larger the off-angle, the higher the step density, so a growth rate in a thickness direction tends to increase. From this fact, it is considered that the increase in the growth rate in the thickness direction may make it difficult for the E3 trap to be generated. It is also considered that in the MOVPE for growing the epi layer 120, by promoting the decomposition of the V-group raw material using the catalyst 250, utilization efficiency of the V-group raw material is increased, and the higher the growth rate in the thickness direction, the less likely it is that E3 traps will be generated. As a result, even when the off-angle increases and the C concentration decreases, it is possible to obtain a low E3 trap concentration such that the E3 trap concentration is suppressed to, for example, $3.0 \times 10^{13}$ cm$^{-3}$ or less. Also, there is a possibility that a method other than the method of promoting the decomposition of the group V raw material using the catalyst 250, can be used.

In this experimental example, the measurement samples a1 to a3 were prepared by growing the epi layer 120 on each of the three substrates a1 to a3 cut out from the one GaN substrate illustrated in FIG. 3 (*a*). Further, the measurement samples m1 to m3 were prepared by growing the epi layer 120 on each of the three substrates m1 to m3 cut out from the one GaN substrate illustrated in FIG. 3 (*b*). From the results of this experimental example, even when the epi layer 120 is grown on the substrate 110 by using an entire GaN substrate illustrated in FIG. 3 (*a*) as one substrate 110 without cutting out the substrates a1 to a3, and even when the epi layer 120 is grown on the main surface 111 of the substrate 110 by using an entire GaN substrate illustrated in FIG. 3 (*b*) as one substrate 110 without cutting out the substrates m1 to m3, it is considered that a correspondence relationship between the off-angle size and the E3 trap concentration and a correspondence relationship between the off-angle size and the carrier concentration $N_D$ as illustrated in FIG. 5, can be obtained at each position on the epi layer 120.

Other Embodiments

As described above, the present invention has been exemplified by way of embodiments and experimental examples. However, the present invention is not limited to the embodiments described in the above-described embodiments and experimental examples, and various modifications can be made without departing from the gist thereof.

For example, the size of the off-angle on the substrate 110 may be preferably 0.4° or more, more preferably 0.6° or more over an entire area of the main surface 111. Thereby, the E3 trap concentration can be suppressed to preferably $3.0 \times 10^{13}$ cm$^{-3}$ or less, more preferably $2.5 \times 10^{13}$ cm$^{-3}$ or less, and further preferably $2.3 \times 10^{13}$ cm$^{-3}$ or less in an entire area of the epi layer 120. Further, the ratio of the maximum E3 trap concentration to the minimum E3 trap concentration is preferably suppressed to 1.5 times or less, more preferably 1.3 times or less, still more preferably 1.2 times or less in an entire area of the epi layer 120. The size of the off-angle on the substrate 110 may be 0.5° or more over an entire area of the main surface 111.

Hereinafter, preferable embodiments of the present invention will be supplementarily described.

(Supplementary Description 1)

There is provided an epitaxial substrate, including:
a GaN substrate whose main surface is a c-plane; and
a GaN layer epitaxially grown on the main surface,
wherein the main surface includes a region where an off-angle is 0.4° or more, and an E3 trap concentration in the GaN layer grown on the region is preferably $3.0 \times 10^{13}$ cm$^{-3}$ or less, more preferably $2.5 \times 10^{13}$ cm$^{-3}$ or less.

(Supplementary Description 2)

There is provided the epitaxial substrate according to the supplementary description 1, wherein the main surface includes a region where an off-angle is 0.6° or more, and an E3 trap concentration in the GaN layer grown on the region is $2.3 \times 10^{13}$ cm$^{-3}$ or less.

(Supplementary Description 3)

There is provided the epitaxial substrate according to the supplementary description 2, wherein in the GaN layer grown on the region (off-angle is 0.4° or more), a ratio of a maximum E3 trap concentration to a minimum E3 trap concentration is preferably 1.5 times or less, more preferably 1.3 times or less.

(Supplementary Description 4)

There is provided an epitaxial substrate, including:
a GaN substrate whose main surface is a c-plane; and
a GaN layer epitaxially grown on the main surface,
wherein the main surface includes a region where an off-angle is 0.4° or more, and in the GaN layer grown on the region, a ratio of a maximum E3 trap concentration to a minimum E3 trap concentration is preferably 1.5 times or less, more preferably 1.3 times or less.

(Supplementary Description 5)

There is provided the epitaxial substrate according to the supplementary description 3 or 4, wherein the main surface includes a region where an off-angle is 0.6° or more, and in the GaN layer grown on the region, a ratio of a maximum E3 trap concentration to a minimum E3 trap concentration is 1.2 times or less.

(Supplementary Description 6)

There is provided the epitaxial substrate according to any one of the supplementary descriptions 1 to 5, wherein an off-angle is preferably 0.4° or more, more preferably 0.5° or more, still more preferably 0.6° or more over an entire area of the main surface.

(Supplementary Description 7)

There is provided the epitaxial substrate according to any one of the supplementary descriptions 1 to 6, wherein an off-angle on the main surface is 1.2° or less.

(Supplementary Description 8)

There is provided the epitaxial substrate according to any one of the supplementary descriptions 1 to 7, wherein the GaN layer is a GaN layer grown by metalorganic vapor phase epitaxy.

(Supplementary Description 9)

There is provided the epitaxial substrate according to any one of the supplementary descriptions 1 to 7, wherein a carbon concentration in the GaN layer grown on the region (off-angle is 0.4° or more) is $5 \times 10^5$ cm$^{-3}$ or less.

(Supplementary Description 10)

There is provided the epitaxial substrate according to any one of the supplementary descriptions 1 to 9, wherein a carrier concentration in the GaN layer grown on the region (off-angle is 0.4° or more) is $6 \times 10^5$ cm$^{-3}$ or more.

(Supplementary Description 11)

There is provided the epitaxial substrate according to any one of the supplementary descriptions 1 to 10, wherein a carrier concentration in the GaN layer grown on the region (off-angle is 0.4° or more) is $1 \times 10^{16}$ cm$^{-3}$ or less.

(Supplementary Description 12)

There is provided the epitaxial substrate according to any one of the supplementary descriptions 1 to 11, wherein the GaN substrate has a dislocation density of less than $1 \times 10^7$ cm$^{-2}$.

(Supplementary Description 13)

There is provided the epitaxial substrate according to any one of the supplementary descriptions 1 to 12, wherein the GaN substrate does not include a dislocation concentration region having a dislocation density of $1 \times 10^7$ cm$^{-2}$ or more.

(Supplementary Description 14)

There is provided an epitaxial substrate, including:
a GaN substrate whose main surface is a c-plane; and
a GaN layer epitaxially grown on the main surface,
wherein an E3 trap concentration in the GaN layer tends to decrease as an off-angle on the main surface increases.

(Supplementary Description 15)

There is provided the epitaxial substrate according to the supplementary description 14, wherein in the above tendency, the degree of decrease in the E3 trap concentration decreases as the off-angle increases.

(Supplementary Description 16)

There is provided the epitaxial substrate according to the supplementary description 14 or 15, wherein a carrier concentration in the GaN layer tends to increase as the off-angle on the main surface increases.

DESCRIPTION OF SIGNS AND NUMERALS

100 Epitaxial substrate (epi substrate)
110 GaN substrate (substrate)
111 Main surface
120, 125 Gan layer (epi layer)
130 Schottky electrode
140 Ohmic electrode
200 MOVPE apparatus
210 Reactor
220 Susceptor
230, 260 Heater
241, 242 Gas supply pipe
250 Catalyst

The invention claimed is:

1. An epitaxial substrate, comprising:
a GaN substrate whose main surface is a c-plane; and
a GaN layer epitaxially grown on the main surface,
wherein the main surface includes a region where an off-angle is 0.4° or more, and an E3 trap concentration in the GaN layer grown on the region is $3.0 \times 10^{13}$ cm$^{-3}$ or less, and
wherein a carrier concentration in the GaN layer grown on the region increases with increasing the off-angle throughout a range of the off-angle of 0.4° to 1° and is $6 \times 10^{15}$ cm$^{-3}$ or more and $1 \times 10^{16}$ cm$^{-3}$ or less throughout the range of the off-angle of 0.4° to 1°.

2. The epitaxial substrate according to claim 1, wherein in the GaN layer grown on the region, a ratio of a maximum E3 trap concentration to a minimum E3 trap concentration is 1.5 times or less.

3. The epitaxial substrate according to claim 1, wherein a carbon concentration in the GaN layer grown on the region is $5 \times 10^{15}$ cm$^{-3}$ or less.

* * * * *